(12) United States Patent
Risca

(10) Patent No.: US 6,241,005 B1
(45) Date of Patent: Jun. 5, 2001

(54) THERMAL INTERFACE MEMBER

(75) Inventor: Mihai S. Risca, Port Washington, NY (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 09/281,159

(22) Filed: Mar. 30, 1999

(51) Int. Cl.[7] ................................. F28F 7/00; H05K 7/20
(52) U.S. Cl. ............................ 165/46; 165/185; 361/690
(58) Field of Search ................... 165/185, 46; 361/699, 361/690

(56) References Cited

U.S. PATENT DOCUMENTS

| | | |
|---|---|---|
| 3,566,960 | 3/1971 | Stuart . |
| 3,818,982 | 6/1974 | Wagner . |
| 3,901,183 | 8/1975 | Wittkower . |
| 3,993,123 * | 11/1976 | Chu et al. ............................ 165/80 |
| 4,008,683 | 2/1977 | Rose . |
| 4,017,403 | 4/1977 | Freeman . |
| 4,057,921 * | 11/1977 | Ball ................................. 40/106.21 |
| 4,072,188 | 2/1978 | Wilson et al. . |
| 4,082,958 | 4/1978 | Kirkpatrick . |
| 4,139,051 | 2/1979 | Jones et al. . |
| 4,194,233 | 3/1980 | Jones et al. . |
| 4,228,358 | 10/1980 | Ryding . |
| 4,261,762 * | 4/1981 | King .................................... 148/1.5 |
| 4,282,924 | 8/1981 | Faretra . |
| 4,306,731 | 12/1981 | Shaw . |
| 4,311,427 | 1/1982 | Coed . |
| 4,457,359 | 7/1984 | Holden . |
| 4,542,298 | 9/1985 | Holden . |
| 4,563,375 * | 1/1986 | Ulrich .................................. 165/46 |
| 4,563,725 * | 1/1986 | Kirby .................................. 361/388 |
| 4,567,938 | 2/1986 | Turner . |
| 4,580,619 * | 4/1986 | Aitken .................................. 165/46 |
| 4,603,466 | 8/1986 | Morley . |
| 4,647,266 | 3/1987 | Turner et al. . |
| 4,680,061 | 7/1987 | Lamont, Jr. . |
| 4,682,566 | 7/1987 | Aitken . |
| 4,949,783 | 8/1990 | Lakios et al. . |
| 4,997,032 * | 3/1991 | Danielson et al. ...................... 165/46 |
| 5,146,981 * | 9/1992 | Samarov ............................... 165/185 |
| 5,323,292 * | 6/1994 | Brzezinski ............................ 361/699 |
| 5,685,363 * | 11/1997 | Orihira et al. ......................... 165/46 |
| 5,720,338 * | 2/1998 | Larson et al. .......................... 165/46 |

FOREIGN PATENT DOCUMENTS 2 137 664   10/1984   (GB) .

OTHER PUBLICATIONS

*Handbook of Physics*, edited by E. U. Condon and Hugh Odishaw, McGraw–Hill Book Company, Inc. 1958; pp. 3–34–3–37.

(List continued on next page.)

Primary Examiner—Ira S. Lazarus
Assistant Examiner—Tho Duong
(74) Attorney, Agent, or Firm—Morgan & Finnegan LLP

(57) ABSTRACT

The invention concerns a self-contained temperature transfer interface, used in processing wafers under high temperature and vacuum conditions, for transferring temperature between a substrate and a temperature control seat. The temperature transfer interface comprises first and second spaced apart panel members which are joined together to define a closed interior, and a fluid disposed within the closed interior. The panel members are formed from a flexible, thermally conductive material. The interface may include a peripheral spacer that limits the compressibility of the closed interior.

9 Claims, 7 Drawing Sheets

OTHER PUBLICATIONS

J. A. Garnder, R. F. Lever and A. R. Michel, "Ion Implant Heat Transfer", IBM Technical Disclosure Bulletin, vol. 21, No. 11, Apr. 1979.

J. B. Harnett, "A Survey of Thermal Accommodation Coefficients", *Advances in Applied Mechanics*, edited by H. L. Dryen and Th. Von Karman, Supplement 1—Rarefied Gas Dynamics, L. Talbot, (ED.), $2^{nd}$ International Symposium on Rarefied Gas Dynamics, Berkeley, California1, Section 1, Molecular Beams and Surface Interactions, 1961, pp. 1–28.

*Scientific Foundations of Vacuum Technique*, $2^{nd}$ Edition, edited by J. M. Lafferty, Section 1.10, "Thermal Conductivity at Low Pressures", John Wiley & Sons, 1962, pp. 42–49.

*Experimental Techniques in Low–Temperature Physics*, by Guy Kendall White, Chapter VI, "Heat Transfer", Oxford, 1959, pp. 178–183.

*Developments in Heat Transfer*, editors W. M. Rohsenow, Chapter 7, "Heat Transfer In Rarefied Gases" by S. A. Schaff, The M.I.T. Press, 1964, pp. 134–168.

M. Sierdzki, "Air–Enhanced Contact Cooling of Wafers", Nuclear Instruments and Methods, In Physics Research B6 (1985), North–Holland, Amsterdam, pp. 237–242.

W. N. Hammer, "Cooling Ion–Implantation Target", IBM Technical Disclosure Bulletin, vol. 19, No. 6, Nov. 1976, pp. 2270–2271.

J. J. Cuomo, "Heat Transfer Process for High Thermal Input Processes" IBM Technical Disclosure Bulletin, vol. 21, No. 2, Jul. 1978, pp. 840–841.

Monty King and Peter H. Rose, "Experiments on Gas Cooling of Wafers", Nuclear Instruments and Methods 189, North–Holland Publishing Company, 1981, pp. 169–173.

F. T. Turner and M. Hutchinson, "Individual Wafer Metallizing System—A Case History, Part 2", Vacuum Technology and Semiconductor Engineering, Industrial Research & Development, Apr. 1981, pp. 147–156.

Marshall Space Flight Center, Alabama, "Advanced Polymer for Multilayer Insulating Blankets", NASA Tech Briefs, Feb. 1996, pp. 59–60.

* cited by examiner

THERMAL INTERFACE MEMBER

FIELD OF THE INVENTION

This invention generally relates to a thermal interface member. More particularly, the invention relates to a thermal interface member used in processing wafers under high temperature and vacuum conditions.

BACKGROUND OF THE INVENTION

Many substrate treatment processes involve exposing a substrate in a vacuum chamber to an ion beam, thereby causing the substrate to absorb heat. Because the substrate can only absorb a certain amount of heat or reach a certain temperature before being damaged, a common problem encountered is how to cool the wafer during treatment. Typical treatment processes require that substrate temperatures be maintained below 100° C. to be compatible with photoresist.

U.S. Pat. No. 4,949,783, which is assigned to the assignee of the present invention and is incorporated in its entirety herein by reference, is directed to a method and apparatus that employs backside gas to cool a wafer. While the patented technique is quite effective, the apparatus typically employs polymeric seals that have potential for degrading at high temperatures, e.g. greater than about 150° C.

Aside from heat generated as a by product of ion beam processing, it is sometimes desirable actually to supply additional heat to a wafer being processed as well as to cool such heated wafer. Such thermal controlled processing in high vacuum and at high temperatures, e.g. greater than about 150° C., also can cause degradation of polymeric materials such as seals, especially when processing is done for long periods of time.

SUMMARY OF THE INVENTION

The subject invention is directed to a compressible temperature transfer interface member having first and second spaced apart panel members which are sealed to each other to define a closed interior. A fluid such as a gas or liquid is disposed in the interior of the membrane. The panel members are formed from a flexible, thermally conductive material. Preferably, the interface includes a peripheral spacer that limits the compressibility of the membrane.

In typical use, the interface member is disposed on a temperature control seat, which is either a source of heat or of cooling. The wafer to be processed is clamped against the interface member so as to compress the interface member against the temperature control seat. Such interface compression creates internal pressure within the interface member which forces the flexible panel surfaces of the interface member to comply with their respective contact surfaces creating a dense array of contact points and increasing surface to surface contact between the interface member and the wafer on the one hand and the interface member and temperature control seat on the other hand to provide a uniform and high speed temperature transfer. Because of the improved contact, heat transfer is primarily through conduction and convection rather than radiation which is slower and more difficult to control.

DETAILED DESCRIPTION OF THE PREFERRED EMBODIMENT OF THE INVENTION

Figure 1:
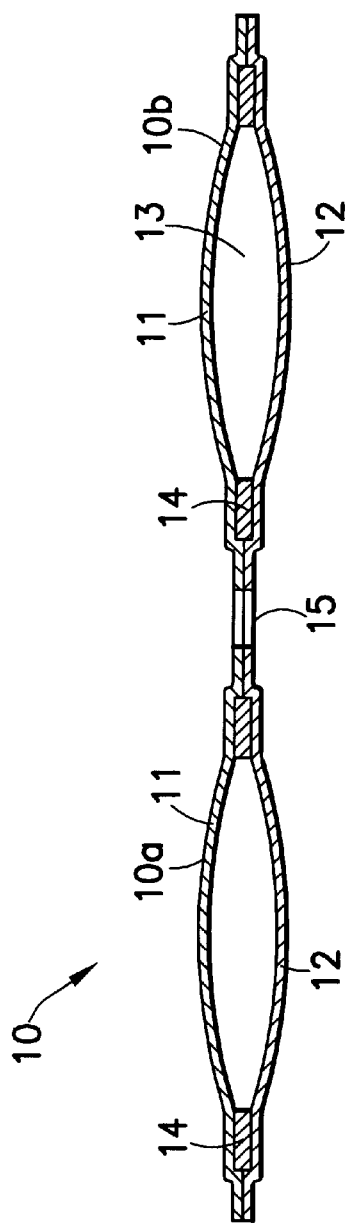
FIG. 1 is a schematic edge view of the thermal interface member of the subject invention in the uncompressed state.
Figure 2:
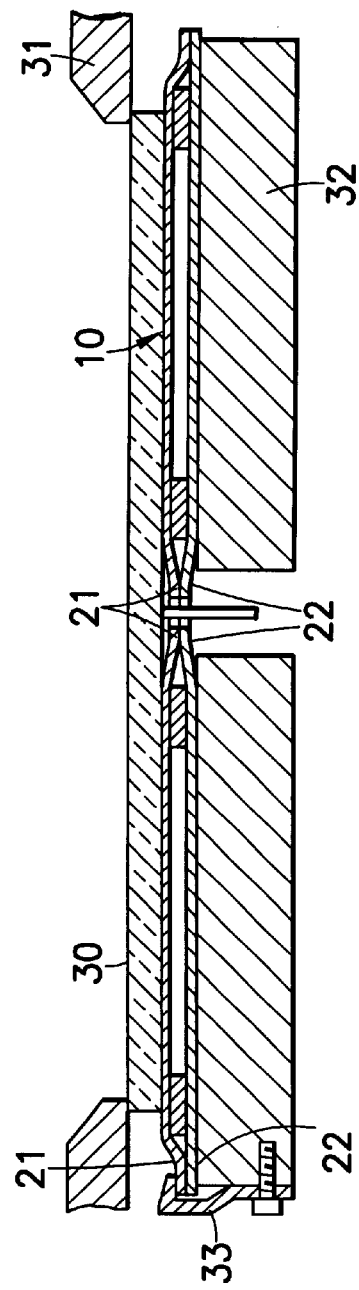
FIG. 2 is a schematic cross-sectional view showing the thermal interface member of the subject invention in the compressed state clamped between the substrate and a thermal control.
Figure 3:
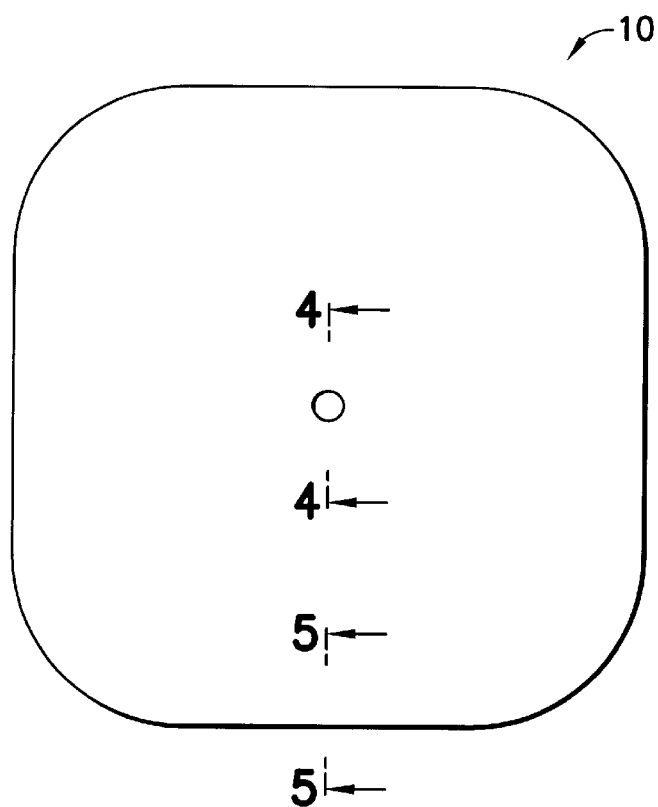
FIG. 3 is a plan view of the thermal interface member of the subject invention.

Referring to FIGS. 1–3 there is illustrated a first embodiment of the thermal transfer interface member 10 of the subject invention. As shown, interface member 10 includes a first panel or membrane member 11 and a second panel or membrane member 12 that is spaced apart from first panel 11. Panel members 11 and 12 are formed from a flexible, high vacuum and high temperature (e.g. greater than 150° C.) compatible, thermally conductive metallic material such as stainless steel or beryllium copper. Preferably, panel members 11 and 12 each include respective shoulder portions 21 and 22 along which the panels are joined together, e.g. by welding, to form a closed interior portion 13 having a first pressure when the interface member is in the uncompressed state. It is also preferable that a spacer member, such as an annular spacer member 14, be disposed within the interior of the interface member along its periphery to limit the compressibility of the interface member. In accordance with the invention, interior portion 13 may contain a gas such as helium or a liquid.

As shown in FIG. 3, interface member 10 may be generally rectangular in plan, having generally rounded corner portions. The shape of the interface member can vary depending upon the shape of the wafer substrate to be processed. Preferably, interface member 10 includes a central orifice 15 that may receive, for example, a temperature measurement probe.

Turning now specifically to FIG. 1, the thermal transfer interface member 10 is shown in the uncompressed state. As shown, in its uncompressed state the interface member has two portions 10a and 10b that are pillow-like in configuration having a greater height at the center than at the ends.

FIG. 2 illustrates the interface member 10 in the compressed state. As shown, interface member 10 is disposed on a substrate base 32. Preferably, base 32 comprises a temperature control seat that can be either a source of cooling or of heat. A clip member 33, which is fixed to substrate base 32, holds interface member 10 against base 32. A substrate 30 to be processed is held against interface member 10 by a clamp member 31. The clamping of the substrate 30 against interface 10 effects compression of interface 10 and an increase of pressure within closed interface interior 13. Because the panel members 11 and 12 are flexible and compliant they form a dense array of contact points with both substrate 30 and thermal control seat 32. Such intimate contact and the good thermal conductivity of the material from which the interface 10 is formed effect temperature transfer mainly through conduction and convection as opposed to radiation which is slower and more difficult to control. Thus, the subject invention provides very efficient thermal transfer and uniformity of temperature on the substrate.

Figure 4:
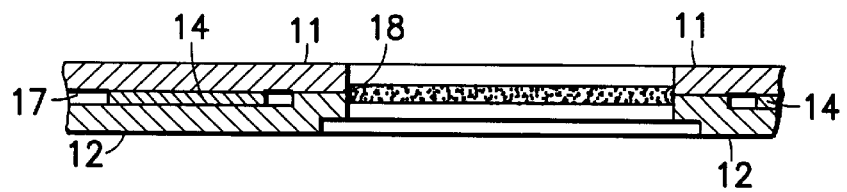
FIG. 4 is a partial cross-sectional view taken along line 4—4 of FIG. 3.

FIG. 4 is a cross-section taken along line 4—4 of FIG. 3. As shown, panel members 11 and 12 are welded to one another at weld points 18 along the periphery of control orifice 15. Spacers 14 define a gap 17 between panels 11 and 12 and limit the compressibility of the overall interface 10.

Figure 5:
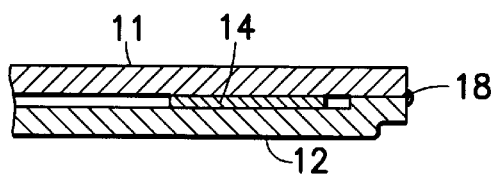
FIG. 5 is a partial cross-sectional view taken along line 5—5 of FIG. 3.

FIG. 5 is a cross-section taken along line 5—5 of FIG. 3. As shown, panel members 11 and 12 are welded to one another at weld point 18 along the periphery of interface 10. Spacer 14 is also disposed between panels 11 and 12 along the periphery of the interface.

Figure 6:
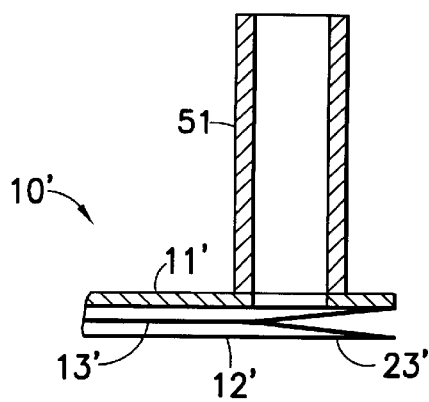
FIG. 6 is a partial cross-sectional view similar to FIG. 4 but of an alternate embodiment of the interface member of the invention.
Figure 7:
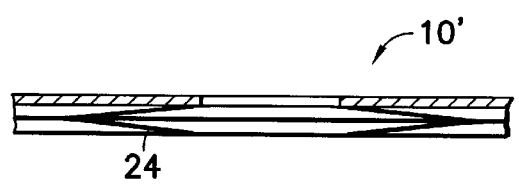
FIG. 7 is a partial cross-sectional view similar to FIG. 5 but of an alternate embodiment of the thermal interface member of the subject invention.

FIGS. 6 and 7 are partial cross-sections similar to that illustrated in FIGS. 5 and 4, respectively, except that they illustrate an alternate embodiment of the invention. As shown, the interface 10' includes a top membrane or panel member 11', a membrane base 12', a peripheral bellows convolution 23 and a central bellows convolution 24, each bellows defining a closed interior portion 13'. Preferably, the interior is filled with a liquid although in certain circumstances another fluid may be used. In this regard, FIG. 6 shows a port 51 by which a liquid may be introduced into the interface interior. The interface is then sealed to confine the liquid. As with the prior embodiment, the interface 10' is formed from a flexible, thermally conductive metallic material such as beryllium copper or steel. When the interface is clamped between a substrate and thermal control seat, the interface is compressed by means of the bellows convolutions to effect increased pressure within the interior of the interface so as to promote intimate contact between the interface and substrate on the one hand and the interface and thermal control seat on the other hand.

Figure 8:
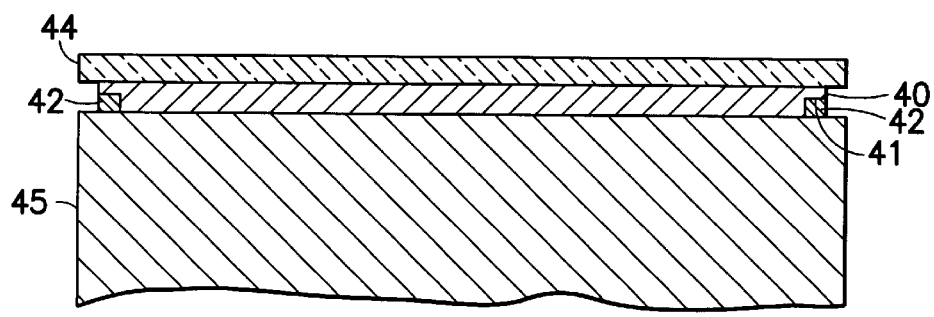
FIG. 8 is a side view of an alternate embodiment of the present invention.

Referring to FIG. 8, there is illustrated another embodiment of the invention. As shown, thermal transfer interface 40, which is disposed between a wafer substrate 44 and a substrate support 45, comprises a compressible thermally conductive, high vacuum compatible metallic wool member. Preferably, the interface 40 has an undercut peripheral portion 41 in which is disposed a spacer ring 42 that limits the compressibility of the interface.

Figure 9:
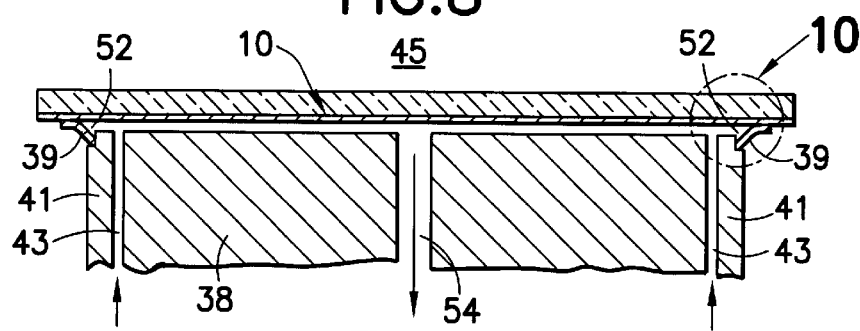
FIG. 9 is a schematic cross-sectional view of an assembly employing the interface member of the subject invention in a gas cooling application.
Figure 10:
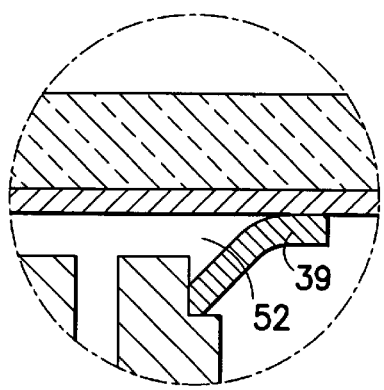
FIG. 10 is an enlarged view along line 10—10 of FIG. 9.

FIGS. 9 and 10 illustrate a backside gas heating/cooling assembly employing the thermal interface of the subject invention. As shown, the assembly includes a wafer base 38 having a pair of end portions 41. Extending from end portions 41 are support members 39. The compressible thermal interface 10 of the subject invention is disposed on supports 39 to define wafer backside gap 52. Wafer base 38 also includes a conduit for introducing a temperature control fluid, such as a cooling gas, into backside gap 52 and a conduit for withdrawing the temperature control fluid from backside gap 52. As shown, the assembly includes a pair of inlet conduits 43 disposed adjacent wafer base ends 41 and a central outlet conduit 54 by which a thermal control fluid may be evacuated from backside gap 52. Thermal interface 10 performs at least two functions. First, the interface provides good thermal transfer between the thermal control fluid and the wafer. Second, interface 10 provides a metallic seal between the backside gas gap 52 and the vacuum processing chamber 55 that does not degrade during prolonged use at extreme temperatures.

To illustrate the effectiveness of the subject interface, several tests were conducted. Specifically, tests were conducted to determine the thermal efficiency in terms of conductivity and temperature uniformity provided by the thermal interface, in a range of temperatures from ambient to about 300° C. The thermal interface used was a double membrane, 3.6" in diameter, vacuum seal welded on the contour, with a annular internal spacer and helium filled. The material was stainless steel 321.

For the convenience of use and possibility of visual inspection during testing, a vacuum bell jar with high vacuum pumping capacity was chosen. The experimental fixture was made to fit the size of the interface and be able to clamp a 4" round wafer. It included a stainless steep support plate, a spiraled cable heater 375W, a 4" diameter aluminum platen and a stainless steel clamp with round opening 3.5" diameter. The heater was clamped between the support plate and the aluminum platen and the clamp was attached to the support plate.

The target temperature was 300° C. (regulated manually). The pressure was 1×10E−4 Torr or lower. To determine the temperature uniformity, at least two thermocouples were used for center and edge measurement (because of the radial symmetry of the fixture). We also determined through a preliminary set of measurements the temperature uniformity over the surface of the platen and also the temperature uniformity over a wafer clamped directly on the platen (without the thermal interface) for reference and comparison. These two sets of measurements results are shown below in Tables A and B and in FIGS. 11 and 12.

TABLE A

Platen Temperature Measurement

| Time | Platen T1 | Platen T2 | Platen T1 − T2 |
|---|---|---|---|
| 0 | 36.6 | 37.4 | −0.8 |
| 1 | 51.5 | 63.6 | −12.1 |
| 2 | 74.2 | 89.1 | −14.9 |
| 3 | 111.1 | 115.9 | −4.8 |
| 4 | 126.8 | 136.7 | −9.9 |
| 5 | 139.9 | 161.1 | −21.2 |
| 6 | 157.1 | 181.5 | −24.4 |
| 7 | 170 | 201.3 | −31.3 |
| 8 | 185.6 | 220.2 | −34.6 |
| 9 | 207 | 244.1 | −37.1 |
| 10 | 219.5 | 257.6 | −38.1 |
| 11 | 238.4 | 273.4 | −35 |
| 12 | 254.3 | 288.9 | −34.6 |
| 13 | 270 | 302.4 | −32.4 |
| 14 | 279.4 | 303.6 | −24.2 |
| 15 | 282 | 301.5 | −19.5 |

TABLE A-continued

Platen Temperature Measurement

| Time | Platen T1 | Platen T2 | Platen T1 − T2 |
|---|---|---|---|
| 16 | 287.1 | 303.6 | −16.5 |
| 17 | 292 | 308.9 | −16.9 |
| 18 | 299.6 | 313.2 | −13.6 |

TABLE B

AlTiC Wafer Clamped without Interface, Temperature measurement

| Time | W/platen T1 | W/platen T2 | W/platen T1 − T2 |
|---|---|---|---|
| 0 | 23.3 | 23.4 | −0.1 |
| 1 | 23.4 | 23.8 | −0.4 |
| 2 | 25 | 26.7 | −1.7 |
| 3 | 29.9 | 32.6 | −2.7 |
| 4 | 34.7 | 40.3 | −5.6 |
| 5 | 41.3 | 49.5 | −8.2 |
| 6 | 49.7 | 59.2 | −9.5 |
| 7 | 60.5 | 71.7 | −11.2 |
| 8 | 72.3 | 83.5 | −11.2 |
| 9 | 84.3 | 100.1 | −15.8 |
| 10 | 99 | 115.4 | −16.4 |
| 11 | 110.6 | 130 | −19.4 |
| 12 | 124.8 | 144.6 | −19.8 |
| 13 | 137.7 | 161.2 | −23.5 |
| 14 | 148.8 | 176.5 | −27.7 |
| 15 | 162.6 | 192.4 | −29.8 |
| 16 | 177.2 | 210.9 | −33.7 |
| 17 | 190.5 | 228.8 | −38.3 |
| 18 | 202.8 | 241.7 | −38.9 |
| 19 | 214.7 | 255.7 | −41 |
| 20 | 224.9 | 266.5 | −41.6 |
| 21 | 235.9 | 278.3 | −42.4 |
| 22 | 245.6 | 287.3 | −41.7 |
| 23 | 256.4 | 296.4 | −40 |
| 24 | 263.8 | 302.8 | −39 |
| 25 | 273.1 | 309.8 | −36.7 |
| 26 | 280.9 | 315.7 | −34.8 |
| 27 | 286 | 319.5 | −33.5 |
| 28 | 285.3 | 321.5 | −36.2 |
| 29 | 284.4 | 320.8 | −36.4 |
| 30 | 283.2 | 319.2 | −36 |
| 31 | 282.2 | 318 | −35.8 |
| 32 | 281 | 316 | −35 |
| 33 | 280 | 315 | −35 |

Two types of wafers were used:

AlTiC, 4" round, 0.07" thick,

Silicon, 4" round, 0.03" thick.

The interface was clamped between the wafer and the platen, the power setting was maintained the same as in the preliminary measurements and the location of the thermocouples was also maintained at the same approximate radial and angular positions. The measurements results are shown below in Tables C & D and in FIGS. 12 and 13, respectively.

TABLE C

AlTiC Wafer Clamped on Interface, Temperature Measurement

| Time | W/Interface T1 | W/Interface T2 | W/Interface T1 − T2 |
|---|---|---|---|
| 0 | 43.3 | 43 | 0.3 |
| 1 | 44 | 44.3 | −0.3 |
| 2 | 51 | 52.7 | −1.7 |
| 3 | 62.7 | 62.3 | 0.4 |

TABLE C-continued

AlTiC Wafer Clamped on Interface, Temperature Measurement

| Time | W/Interface T1 | W/Interface T2 | W/Interface T1 − T2 |
|---|---|---|---|
| 4 | 77 | 73.4 | 3.6 |
| 5 | 92.9 | 86.3 | 6.6 |
| 6 | 109.9 | 100.8 | 9.1 |
| 7 | 127.6 | 116.4 | 11.2 |
| 8 | 144.6 | 132 | 12.6 |
| 9 | 163.3 | 148.2 | 15.1 |
| 10 | 178 | 162.4 | 15.6 |
| 11 | 194.2 | 178.5 | 15.7 |
| 12 | 208.2 | 199.5 | 8.7 |
| 13 | 220.5 | 215.5 | 5 |
| 14 | 233.1 | 223.4 | 9.7 |
| 15 | 244.4 | 233.5 | 10.9 |
| 16 | 255.5 | 242.8 | 12.7 |
| 17 | 265.6 | 252 | 13.6 |
| 18 | 274.5 | 261.1 | 13.4 |
| 19 | 282.7 | 269.5 | 13.2 |
| 20 | 289.3 | 278.2 | 11.1 |
| 21 | 296.1 | 286.8 | 9.3 |
| 22 | 302.9 | 293.7 | 9.2 |
| 23 | 307.9 | 300.3 | 7.6 |
| 24 | 310 | 302.6 | 7.4 |
| 25 | 308.3 | 301.8 | 6.5 |
| 26 | 304.5 | 299.3 | 5.2 |
| 27 | 300.5 | 296.3 | 4.2 |
| 28 | 297 | 294 | 3 |
| 29 | 294.7 | 292.3 | 2.4 |
| 30 | 293.6 | 291.8 | 1.8 |
| 31 | 293.9 | 292.3 | 1.6 |
| 32 | 295 | 293.7 | 1.3 |
| 33 | 297 | 295.6 | 1.4 |
| 34 | 299.2 | 297.9 | 1.3 |
| 35 | 301.4 | 300 | 1.4 |
| 36 | 303.6 | 302 | 1.6 |
| 37 | 305 | 303.4 | 1.6 |
| 38 | 306.2 | 304.9 | 1.3 |
| 39 | 307.3 | 306.1 | 1.2 |
| 40 | 307.6 | 306.4 | 1.2 |

TABLE D

Silicon Wafer Clamped on Interface Temperature Measurement

| Time | SW/Interface T1 | SW/Interface T2 | SW/Interface T1 − T2 |
|---|---|---|---|
| 0 | 46.9 | 48.1 | −1.2 |
| 1 | 51.8 | 55.1 | −3.3 |
| 2 | 64.9 | 68.7 | −3.8 |
| 3 | 78.1 | 82.3 | −4.2 |
| 4 | 94.4 | 96.7 | −2.3 |
| 5 | 109.2 | 112.3 | −3.1 |
| 6 | 124.2 | 128.1 | −3.9 |
| 7 | 135.4 | 139.6 | −4.2 |
| 8 | 147.8 | 151.1 | −3.3 |
| 9 | 161.3 | 164.8 | −3.5 |
| 10 | 174.5 | 175 | −0.5 |
| 11 | 184.9 | 186 | −1.1 |
| 12 | 196.7 | 197 | −0.3 |
| 13 | 209.8 | 208 | 1.8 |
| 14 | 219.7 | 218.7 | 1 |
| 15 | 228.5 | 227.9 | 0.6 |
| 16 | 246.5 | 233.3 | 13.2 |
| 17 | 255.7 | 241.8 | 13.9 |
| 18 | 263.8 | 249.8 | 14 |
| 19 | 272.7 | 257.4 | 15.3 |
| 20 | 279.6 | 264.6 | 15 |
| 21 | 286.6 | 271.8 | 14.8 |
| 22 | 292.8 | 278 | 14.8 |
| 23 | 299.7 | 286.5 | 13.2 |

TABLE D-continued

Silicon Wafer Clamped on Interface
Temperature Measurement

| Time | SW/Interface T1 | SW/Interface T2 | SW/Interface T1 – T2 |
|---|---|---|---|
| 24 | 305.6 | 291.1 | 14.5 |
| 25 | 309.7 | 295.9 | 13.8 |
| 26 | 313.3 | 299.1 | 14.2 |
| 27 | 312.2 | 299.5 | 12.7 |
| 28 | 310.8 | 299.5 | 11.3 |
| 29 | 309.7 | 299.7 | 10 |
| 30 | 308.8 | 299.7 | 9.1 |
| 31 | 308.2 | 299.5 | 8.7 |
| 32 | 307.9 | 299.5 | 8.4 |
| 33 | 307.5 | 299.4 | 8.1 |
| 34 | 307.1 | 299.3 | 7.8 |
| 35 | 307 | 299.3 | 7.7 |
| 36 | 306.8 | 299.2 | 7.6 |
| 37 | 306.4 | 299.2 | 7.2 |
| 38 | 306.2 | 299.2 | 7 |

Figure 11:
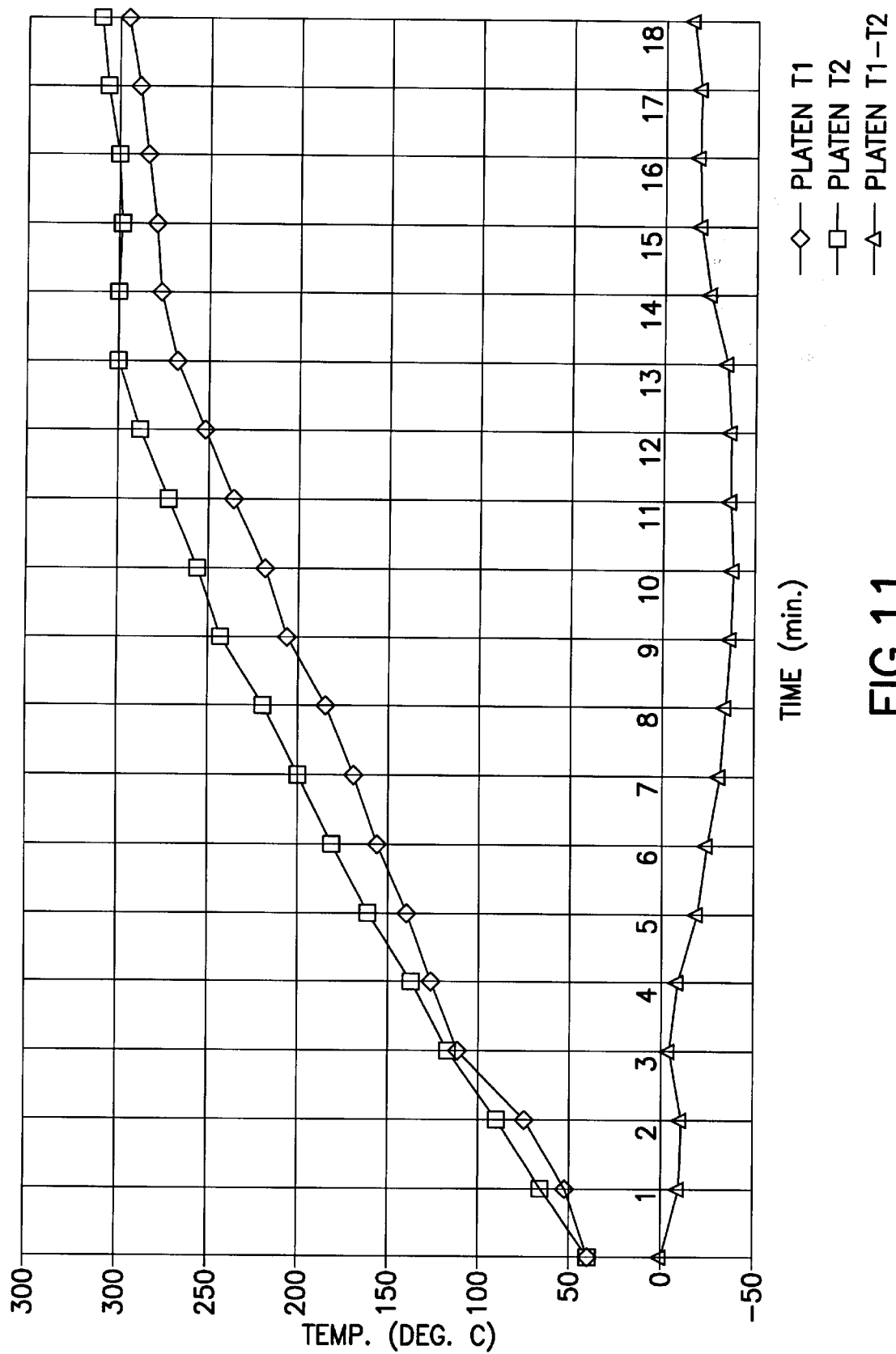
FIG. 11 is a graph showing temperature measurements on a reference platen.

Referring to FIG. 11, the quick ramp-up of the temperature of the platen alone determined a maximum temperature difference between the two points of measurement (T1 at center and T2 at edge) of 38° C., which reduced after temperature regulation at 300° C. to a difference of 14° C. The temperature for this fixture higher at edge that the center.

Figure 12:
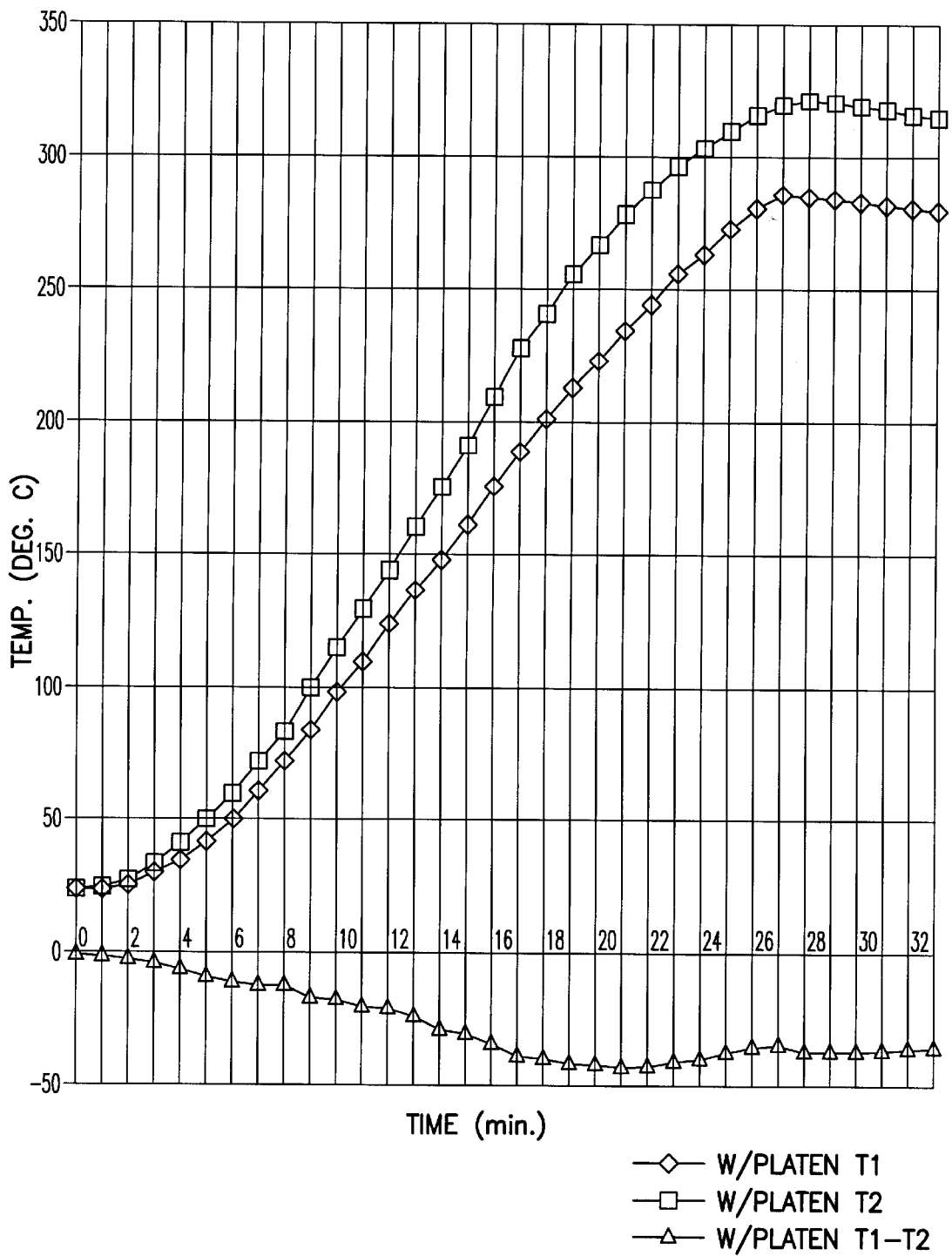
FIG. 12 is a graph showing temperature measurements for an AlTiC wafer clamped to the reference platen without any thermal interface of the invention.

Referring to FIG. 12, the temperature nonuniformity of the AlTiC wafer clamped on the platen without the subject interface reached a maximum of 42° C. that reduced at only 35° C. after temperature regulation. The temperature was higher at the edge than at the center, following the platen thermal pattern and the proximity of contact points, due to the clamping force location. The speed of temperature rise was about half of that on the platen.

Figure 13:
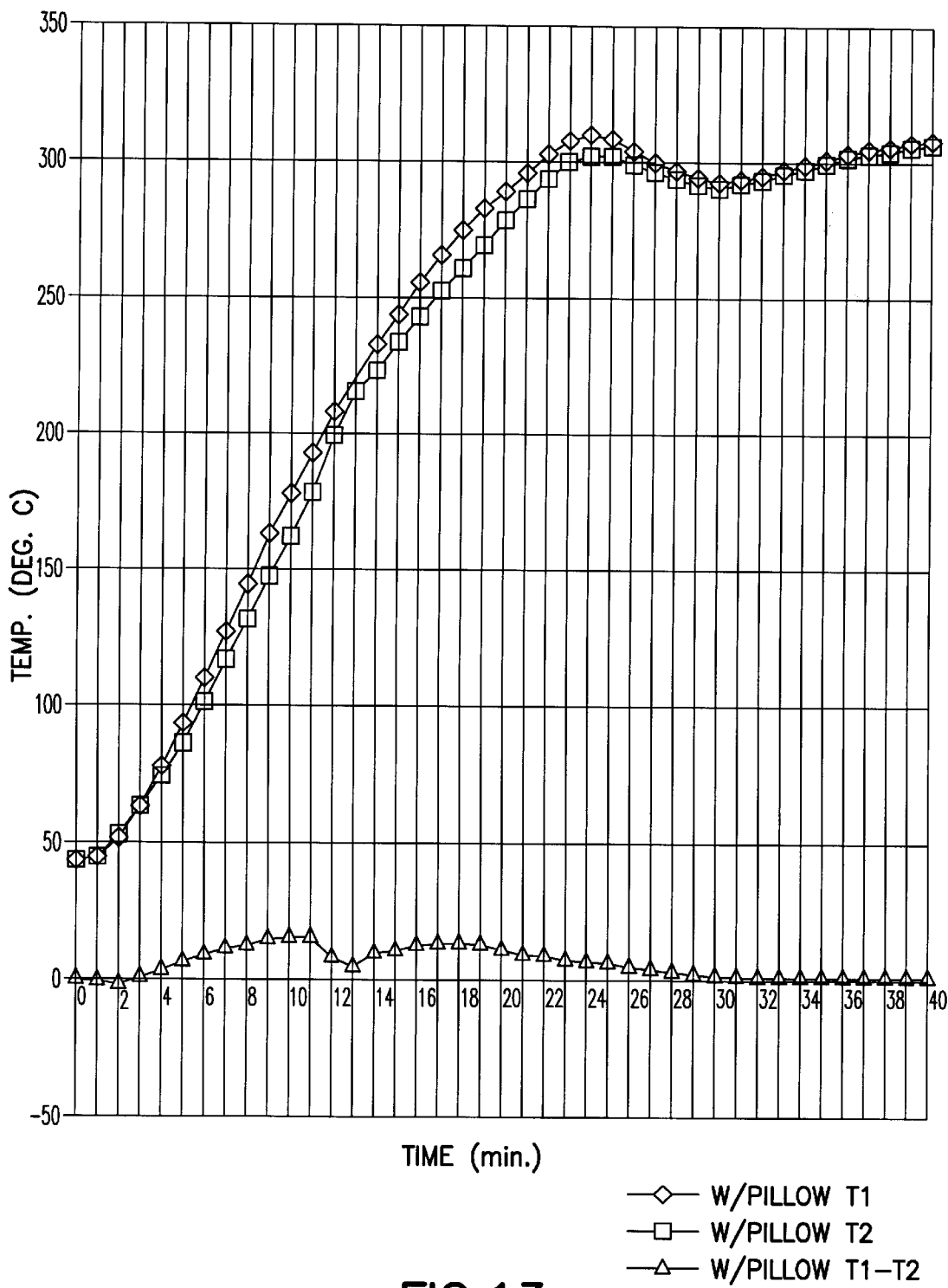
FIG. 13 is a graph showing temperature measurements of an AlTiC wafer clamped against the thermal interface of the subject invention.

Referring to FIG. 13, the temperature nonuniformity on the AlTiC wafer clamped on to the interface of the subject invention reached a maximum of 16° C. that reduced at 1.2° C. after temperature regulation. The temperature was higher at center than at the edges, showing a reverse distribution from the platen thermal pattern. The speed of temperature rise was about 20% higher than the previous case.

Figure 14:
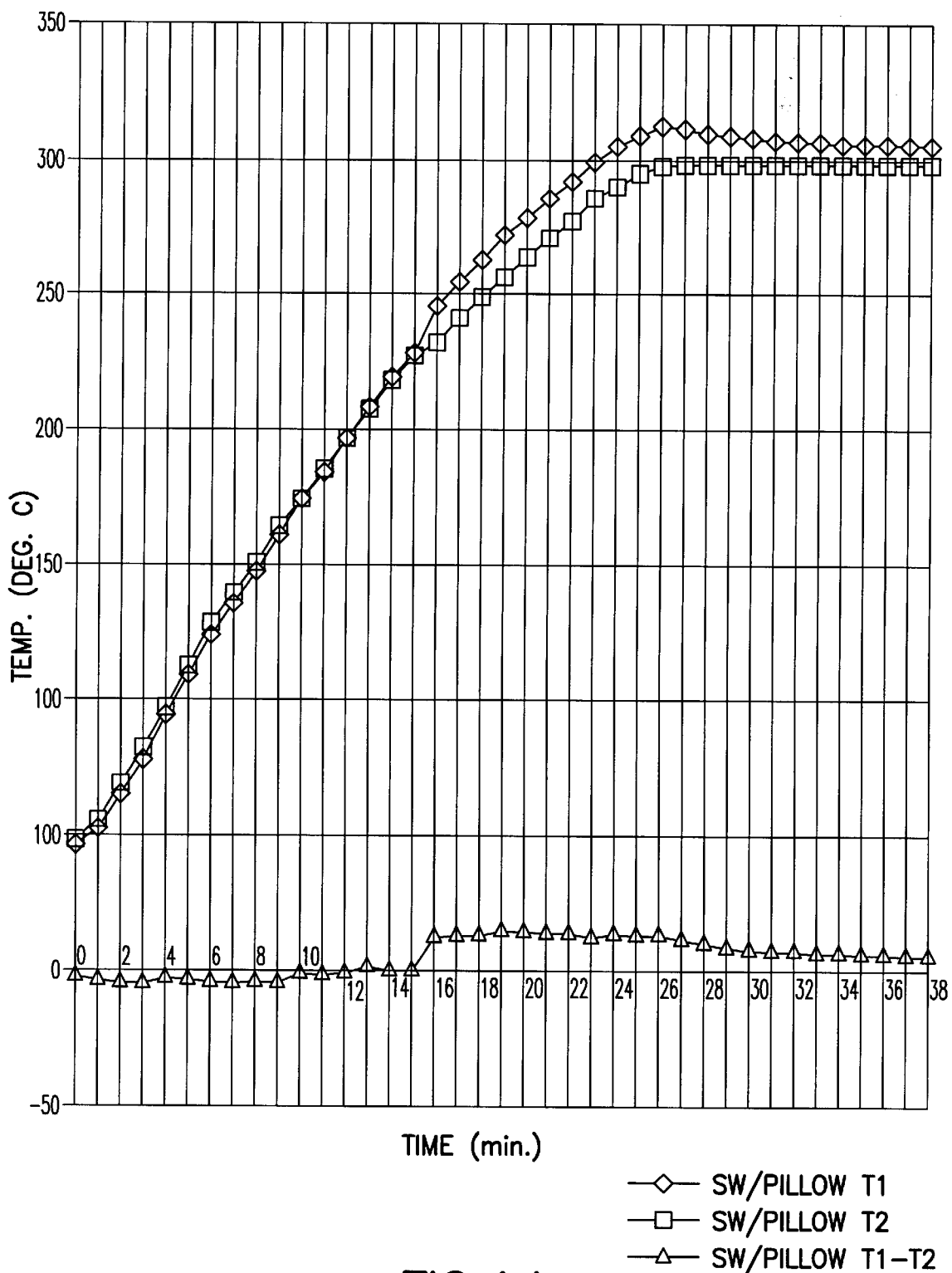
FIG. 14 is a graph showing temperature measurements of a silicon wafer clamped against the thermal interface of the subject invention.

Referring to FIG. 14, the temperature nonuniformity of the silicon wafer clamped on the subject interface reached a maximum of 15° C. that reduced at 7° C. after temperature regulation. The measurement showed signs of better uniformity which was compromised by the accidental wrinkling of one of the membranes of the interface. The temperature was in the higher region, higher at center than the edge, showing again a reverse distribution from the platen thermal pattern. The speed of temperature rise was about 10% higher than the wafer clamped without the interface.

From the above it will be appreciated that the subject invention provides several advantages over known technology. For example, the subject invention permits thermal controlled processing in high vacuum for temperatures above 250° C. where polymeric materials reach their high thermal limit without detrimental side effects. Indeed, the subject interface can be used in temperatures exceeding 800° C. Second, the subject invention does not leak gases or vapors into the high vacuum environment. Third, the subject interface provides relatively high speed temperature transfer for dynamic thermal processes. Fourth, the subject interface is simple in construction, relatively inexpensive and easy to service. Other advantages will be apparent to those skilled in the art.

While preferred embodiment of this invention has been illustrated and described, the invention is capable of modification and addition without departing from its basic principles. Accordingly the invention is not intended to be limited to the exact embodiment illustrated. The scope of the invention is intended to be determined by reference to the claims and their equivalents in light of the prior art.

What is claimed is:

1. A self-contained temperature transfer interface for transferring temperature between a substrate and a temperature control seat comprising:

first and second spaced apart panel members which are joined together to define a closed interior, said panel members being formed from a flexible, thermally conductive material; and a gas disposed within said closed interior said interface being compressible between said temperature control seat and said substrate.

2. An interface according to claim 1 which further comprises a peripheral spacer member disposed between said first and second panel members to limit the compressibility of the interface.

3. An interface according to claim 1 wherein said first and second panel members are formed from beryllium copper.

4. An interface according to claim 1 wherein said first and second panels are formed from stainless steel.

5. An interface according to claim 1 wherein said gas is an inert gas.

6. An interface according to claim 5 wherein said gas is helium.

7. An interface according to claim 1 which further comprises a bellows member disposed between said first and second panel members.

8. An interface according to claim 7 wherein said bellows member is formed from a flexible thermally conductive material.

9. A self-contained temperature transfer interface for transferring temperature between a substrate in a vacuum and a temperature control seat comprising:

first and second panel members, each panel member having a periphery, said panel members being sealed adjacent their peripheries to define a closed interior, said panel members being formed from a flexible, high vacuum compatible, thermally conductive material; and a gas disposed in said closed interior such that in an uncompressed state there is a first pressure in said interior and when said interface member is compressed between said substrate and said seat there is a second higher pressure in said interior, such that said panel members are put into intimate contact with the substrate and temperature control seat, with said temperature transfer being primarily from conduction and convection rather than radiation.

* * * * *